(12) United States Patent
Leong et al.

(10) Patent No.: US 12,620,981 B2
(45) Date of Patent: May 5, 2026

(54) TECHNIQUES FOR REDUCTION OF DEGRADATION IN CHANNELS CAUSED BY BIAS TEMPERATURE INSTABILITY

(71) Applicant: Intel Corporation, Santa Clara, CA (US)

(72) Inventors: Han Hua Leong, Butterworth (MY); Sze Ming Chow, Bayan Lepas (MY); David Mendel, Sunnyvale, CA (US); Jia Yong Chang, Bayan Lepas (MY); Ryan Caldwell, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 17/740,704

(22) Filed: May 10, 2022

(65) Prior Publication Data

US 2022/0268837 A1 Aug. 25, 2022

(51) Int. Cl.

*H03K 5/08* (2006.01)
*G01R 31/28* (2006.01)
*G01R 31/317* (2006.01)

(52) U.S. Cl.

CPC ........... *H03K 5/08* (2013.01); *G01R 31/2824* (2013.01); *G01R 31/2849* (2013.01); *G01R 31/31723* (2013.01); *G01R 31/31726* (2013.01)

(58) Field of Classification Search

CPC .. H03K 5/08; G01R 31/2824; G01R 31/2849; G01R 31/31723; G01R 31/31726
See application file for complete search history.

(56) References Cited

U.S. PATENT DOCUMENTS

2002/0097682 A1* 7/2002 Enam ...................... H03L 7/091 398/9
2009/0182799 A1* 7/2009 Huang .................... H04L 41/00 709/201
2013/0147526 A1* 6/2013 Kim .......................... G06F 1/08 327/114
2014/0207979 A1* 7/2014 Wu ......................... G06F 13/28 710/22
2015/0194951 A1 7/2015 Surgutchik et al.
2016/0019174 A1* 1/2016 Sreenath .................. H04B 1/40 375/219
2021/0058079 A1* 2/2021 Chang .................... H03K 5/135
2023/0038670 A1* 2/2023 Narasimhan .............. G06F 1/10

FOREIGN PATENT DOCUMENTS

CN 116505928 A * 7/2023 ........... H03K 17/693

* cited by examiner

*Primary Examiner* — Hyun Soo Kim
(74) *Attorney, Agent, or Firm* — InventIQ Legal LLP; Steven J. Cahill

(57) ABSTRACT

An integrated circuit includes a multiplexer circuit coupled to receive a first clock signal and a second clock signal and coupled to provide an output clock signal to a channel. A protection circuit is coupled to receive a feedback signal from the channel. The protection circuit causes the multiplexer circuit to provide oscillations in the second clock signal to the output clock signal in response to the feedback signal indicating that the channel is idle to cause the channel to be in a protection mode that reduces degradation from bias temperature instability. The protection circuit causes the multiplexer circuit to provide oscillations in the first clock signal to the output clock signal in response to the feedback signal indicating that the channel is active.

20 Claims, 6 Drawing Sheets

| | Status | | | Control | | |
|---|---|---|---|---|---|---|
| Transceiver Channels | Selected Clock | Reset Status | PHY Status | BTI Protection Mode | DFT/DFD Mode | EV Mode |
| CH0 | Displaying the selected transceiver clock signal or BTI protection clock signal | Displaying the transceiver reset status, such as TX reset, TX PMA reset, RX reset, RX PMA reset | Displaying PHY status such as TX PLL lock status, CDR lock status, TX PMA ready, RX PMA ready | Options:<br>1. User-controllable BTI instr. mode<br>2. Automatic BTI protection mode<br>3. Device RBC mode | Additional control on clock signals, such as transceiver clock, BTI protection clock, feedback clock, row clock, etc. | Enable EV mode measurements such as data rate, adaptation, BER/ Eye measurement, Fmax, etc. |
| CH1 | Displaying the selected transceiver clock signal or BTI protection clock signal | Displaying the transceiver reset status, such as TX reset, TX PMA reset, RX reset, RX PMA reset | Displaying PHY status such as TX PLL lock status, CDR lock status, TX PMA ready, RX PMA ready | Options:<br>1. User-controllable BTI instr. mode<br>2. Automatic BTI protection mode<br>3. Device RBC mode | Additional control on clock signals, such as transceiver clock, BTI protection clock, feedback clock, row clock, etc. | Enable EV mode measurements such as data rate, adaptation, BER/ Eye measurement, Fmax, etc. |
| CH2 | Displaying the selected transceiver clock signal or BTI protection clock signal | Displaying the transceiver reset status, such as TX reset, TX PMA reset, RX reset, RX PMA reset | Displaying PHY status such as TX PLL lock status, CDR lock status, TX PMA ready, RX PMA ready | Options:<br>1. User-controllable BTI instr. mode<br>2. Automatic BTI protection mode<br>3. Device RBC mode | Additional control on clock signals, such as transceiver clock, BTI protection clock, feedback clock, row clock, etc. | Enable EV mode measurements such as data rate, adaptation, BER/ Eye measurement, Fmax, etc. |
| • • • | • • • | • • • | • • • | • • • | • • • | • • • |
| CHN | Displaying the selected transceiver clock signal or BTI protection clock signal | Displaying the transceiver reset status, such as TX reset, TX PMA reset, RX reset, RX PMA reset | Displaying PHY status such as TX PLL lock status, CDR lock status, TX PMA ready, RX PMA ready | Options:<br>1. User-controllable BTI instr. mode<br>2. Automatic BTI protection mode<br>3. Device RBC mode | Additional control on clock signals, such as transceiver clock, BTI protection clock, feedback clock, row clock, etc. | Enable EV mode measurements such as data rate, adaptation, BER/ Eye measurement, Fmax, etc. |

FIG. 4

TECHNIQUES FOR REDUCTION OF DEGRADATION IN CHANNELS CAUSED BY BIAS TEMPERATURE INSTABILITY

FIELD OF THE DISCLOSURE

The present disclosure relates to electronic circuits, and more particularly, to techniques for reduction of degradation in channels caused by bias temperature instability.

BACKGROUND

Bias Temperature Instability (BTI) is a common degradation phenomenon that causes aging of semiconductor devices. BTI causes a performance reliability issue in semiconductor devices that commonly occurs when an application is under static conditions for an extended amount of time. BTI degradation of semiconductor devices is accelerated under stressed voltage and temperature conditions.

BRIEF DESCRIPTION OF THE DRAWINGS

FIG. 4 illustrates an example of a graphical user interface (GUI) generated by a user interface that receives the output signals BTS from the sideband interface and that generates the user control signals BINS shown in FIG. 1.

DETAILED DESCRIPTION

In some programmable logic integrated circuit systems, the effects of degradation caused by Bias Temperature Instability (BTI) can be mitigated by modifying pin assignments and using rule based configuration to turn on BTI mitigation circuitry. However, these integrated circuit systems do not have detection mechanisms to prove that BTI protection has been enabled and is operating correctly. As examples, a transceiver in an integrated circuit system may be damaged if there is a rule based configuration error in enabling BTI protection, after an active channel is reconfigured into an unused channel without triggering BTI protection, loss of signal from a link partner, or a link partner has switched to different data rates.

According to some examples disclosed herein, an integrated circuit may include a protection circuit that provides Bias Temperature Instability (BTI) protection of circuits in a channel. The protection circuit can reduce the effects of BTI degradation in the channel by reducing the frequency of one or more clock signals during a BTI protection mode. The BTI protection mode is turned on when the channel is not being used (i.e., idle) and is not in a power down state. The BTI protection mode may, for example, be controlled by software that provides an alert status to a user if circuitry in the integrated circuit fails. The BTI protection mode improves circuit reliability and performance.

One or more specific examples are described below. In an effort to provide a concise description of these examples, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Throughout the specification, and in the claims, the term "connected" means a direct electrical connection between the circuits that are connected, without any intermediary devices. The term "coupled" means either a direct electrical connection between circuits or an indirect electrical connection through one or more passive or active intermediary devices. The term "circuit" may mean one or more passive and/or active electrical components that are arranged to cooperate with one another to provide a desired function.

Figure 1:
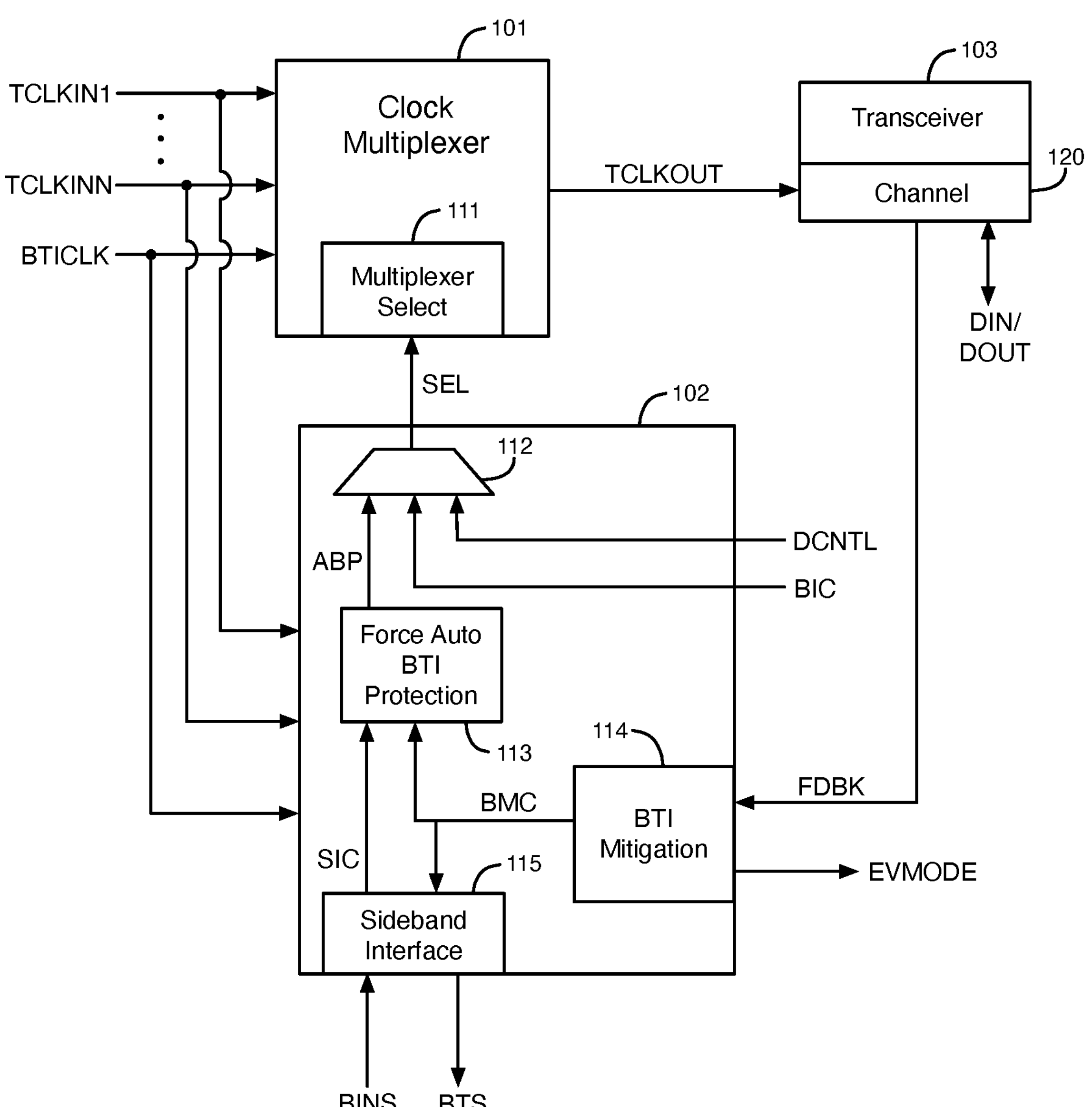
FIG. 1 is a diagram illustrating an example of a Bias Temperature Instability (BTI) control circuit that reduces the effects of degradation caused by BTI in a transceiver circuit during a BTI protection mode.

FIG. 1 is a diagram illustrating an example of a Bias Temperature Instability (BTI) control circuit that reduces the effects of degradation caused by BTI in a transceiver circuit during a BTI protection mode. FIG. 1 illustrates a circuit system that includes a clock multiplexer circuit 101, a BTI clock protection control circuit 102, and a transceiver circuit 103. The BTI control circuit of FIG. 1 includes clock multiplexer circuit 101 and BTI clock protection control circuit 102. The circuit system of FIG. 1 may be provided in one or more electronic integrated circuits, such as programmable logic integrated circuits (ICs), microprocessor ICs, application specific ICs, memory ICs, graphics processing unit ICs, etc. As a specific example that is not intended to be limiting, circuits 101-102 may be in a first integrated circuit such as a programmable logic or microprocessor IC, and transceiver circuit 103 may be in a second integrated circuit that is separate from the first integrated circuit. In this example, the first and second integrated circuits may be in the same integrated circuit package or on the same circuit board.

This disclosure discusses circuit systems that can be implemented with integrated circuit devices, including programmable logic devices (PLDs) and field programmable gate arrays (FPGAs). As discussed herein, circuit systems may use hard logic and soft logic of an FPGA. As used herein, "hard logic" generally refers to circuits in an integrated circuit device (e.g., a programmable logic integrated circuit) that are not programmable by an end user. The circuits in the integrated circuit device that are programmable by the end user are considered "soft logic."

Referring to FIG. 1, clock multiplexer circuit 101 includes multiplexer select circuit 111. BTI clock protection control circuit 102 includes multiplexer circuit 112, force automatic BTI protection circuit 113, BTI mitigation circuit 114, and sideband interface circuit 115. An N number of input transceiver clock signals TCLKIN1 . . . TCLKINN are provided to inputs of clock multiplexer circuit 101 and to inputs of BTI clock protection control circuit 102. N may be any integer number greater than 1. An additional clock signal BTICLK is provided to an additional input of clock multiplexer circuit 101 and to an additional input of BTI clock protection control circuit 102. Clock signal BTICLK is a dedicated clock signal that is used to reduce degradation caused by BTI during the BTI protection mode, as discussed in further detail herein. Clock signal BTICLK has a substantially lower frequency than the transceiver clock signals TCLKIN1 . . . TCLKINN.

Clock multiplexer circuit 101 selects one of the input clock signals BTICLK, TCLKIN1, . . . or TCLKINN and provides the oscillations (i.e., the rising and falling edges) in the selected clock signal to an input of the transceiver circuit 103 as an output transceiver clock signal TCLKOUT. The transceiver circuit 103 includes a channel circuit 120 that transmits output data DOUT and receives input data DIN in response to the transceiver clock signal TCLKOUT. Multiplexer select circuit 111 determines which one of the input clock signals BTICLK, TCLKIN1, . . . or TCLKINN that clock multiplexer circuit 101 selects to provide as the output clock signal TCLKOUT in response to a select signal SEL. Select signal SEL is generated by multiplexer circuit 112 in BTI clock protection circuit 102.

Multiplexer circuit 112 provides one of signals DCNTL or ABP as the select signal SEL. Multiplexer circuit 112 also receives a BTI instrumentation control signal BIC that determines if the BTI control circuit is in an automatic BTI protection mode controlled by circuit 113 or in a manual BTI protection mode. Signal DCNTL is a device rule based control (RBC) signal that indicates if the channel circuit 120 should be placed in the BTI protection mode during the manual BTI protection mode. Signal ABP is an automatic BTI protection signal generated by the force auto BTI protection circuit 113 during the automatic BTI protection mode. Further details of the operation of BTI clock protection circuit 102 are discussed below with respect to FIG. 2.

Figure 2:
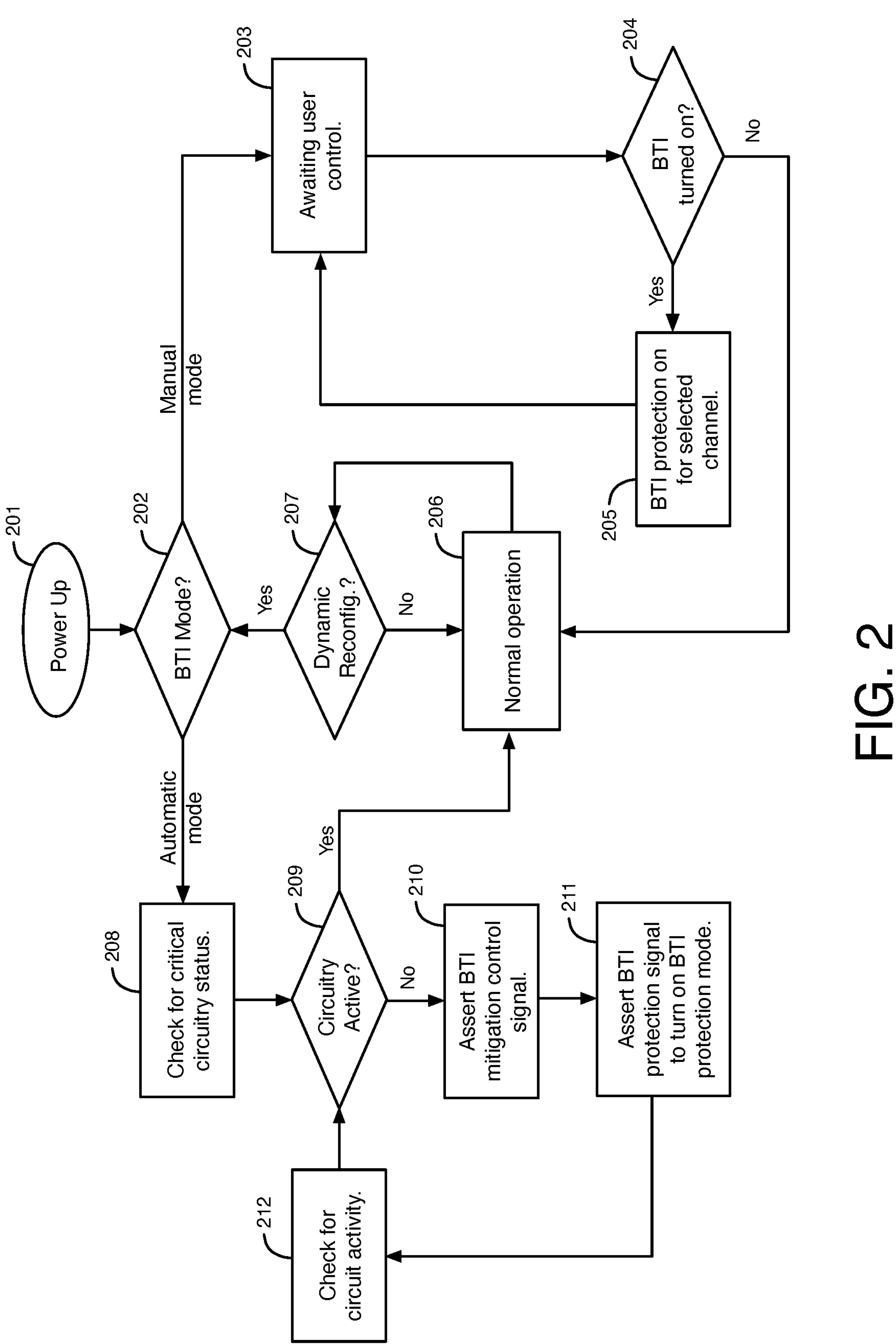
FIG. 2 is a flow chart that illustrates examples of operations that may be performed to implement BTI protection of the transceiver circuit of FIG. 1.

FIG. 2 is a flow chart that illustrates examples of operations that may be performed to implement BTI protection of the transceiver circuit 103 of FIG. 1. In operation 201, the circuit system of FIG. 1 powers up. In operation 202, the BTI control circuit of FIG. 1 determines whether to function in the automatic BTI protection mode or in the manual BTI protection mode based on the value of the BTI instrumentation control signal BIC. If the BTI instrumentation control signal BIC has a value that indicates the manual BTI protection mode, the BTI control circuit of FIG. 1 enters the manual BTI protection mode and awaits user control in operation 203. In the manual BTI protection mode, the multiplexer circuit 112 provides the value of the device rule based control signal DCNTL to multiplexer select circuit 111 in the select signal SEL. The multiplexer select circuit 111 causes the clock multiplexer 101 to select one of the input clock signals BTICLK, TCLKIN1, . . . or TCLKINN as the output clock signal TCLKOUT based on the value of signal DCNTL in the manual BTI protection mode.

Then, in operation 204, the BTI control circuit of FIG. 1 determines whether to turn on the BTI protection mode based on the value of the device rule based control signal DCNTL. If the device rule based control signal DCNTL is set to a value that indicates the BTI protection mode is to be turned on in operation 204, then the multiplexer select circuit 111 causes the clock multiplexer 101 to select the BTICLK clock signal as the output clock signal TCLKOUT provided to the transceiver circuit 103 and channel circuit 120. In response to receiving the BTICLK clock signal as the TCLKOUT clock signal, BTI protection mode is turned on for channel circuit 120 in operation 205 (and optionally for additional channels in transceiver circuit 103). The BTICLK clock signal may, for example, have a substantially lower frequency than the frequency of any of the input transceiver clock signals TCLKIN1 . . . TCLKINN. As a result of receiving the lower frequency clock signal TCLKOUT, channel circuit 120 experiences less degradation as a result of BTI effects during the BTI protection mode. Each of the channels in the transceiver circuit 103, including channel circuit 120, may include a transmitter circuit, a receiver circuit, or any combination thereof.

If the device rule based control signal DCNTL is set to a value that indicates the BTI protection mode is to be turned off in operation 204, then the multiplexer select circuit 111 causes the clock multiplexer 101 to select one of the input transceiver clock signals TCLKIN1 . . . or TCLKINN as the output clock signal TCLKOUT provided to the transceiver circuit 103. In response to receiving one of the input transceiver clock signals TCLKIN1 . . . or TCLKINN as the output clock signal TCLKOUT, BTI protection mode is off, and the channel circuit 120 functions in normal operation in operation 206.

During normal operation, a determination is made in operation 207 as to whether dynamic reconfiguration of one or more of the integrated circuits in the circuit system of FIG. 1 has occurred. Dynamic reconfiguration of an integrated circuit that affects the activity of the channels in the transceiver circuit 103 is monitored in operation 207. If dynamic reconfiguration is not detected in operation 207, then normal operation continues in operation 206. If dynamic reconfiguration that affects the activity of the channels in the transceiver circuit 103 is detected in operation 207, then the procedure of FIG. 2 returns to operation 202.

If the BTI instrumentation control signal BIC has a value that indicates the automatic BTI protection mode, the BTI control circuit of FIG. 1 enters the automatic BTI protection mode in operation 202. In operation 208, the status of critical circuitry in the circuit system of FIG. 1 is checked by the BTI control circuit or by another circuit or device. The critical circuitry that is checked in operation 208 may include the transceiver circuit 103, including channel circuit 120. In operation 209, a determination is made as to whether the critical circuitry (such as channel circuit 120) is active. If a determination is made that the critical circuitry (e.g., channel circuit 120) is active in operation 209, then normal operation proceeds in operation 206. If a determination is made that the critical circuitry (e.g., channel circuit 120) is inactive in operation 209, then BTI protection mode is turned on in operations 210-211.

The BTI mitigation circuit 114 receives one or more feedback signals FDBK from the transceiver circuit 103/channel circuit 120. The feedback signals FDBK may include, for example, one or more feedback clock signals that are generated by channel circuit 120, one or more internal status signals from channel circuit 120, and/or design-for-test or design-for debug signals. The internal status signals may indicate whether channel circuit 120 (and/or other channels in transceiver circuit 103) are inactive (i.e., idle or unused) or active. BTI mitigation circuit 114 may continuously or periodically monitor the feedback signals FDBK to determine whether channel circuit 120 (and other channels in the transceiver circuit 103) are inactive or active in operation 209. If the BTI mitigation circuit 114 determines that the channel circuit 120 is inactive (e.g., idle for a period of time) in operation 209, then BTI mitigation circuit 114 may assert a BTI mitigation control signal BMC in operation 210 to turn on the BTI protection mode for channel 120. The BTI mitigation control signal BMC is provided to an input of the force auto BTI protection circuit 113, as shown in FIG. 1. In response to sensing that the BTI mitigation control signal BMC has been asserted in operation 210, the force auto BTI protection circuit 113 asserts the automatic BTI protection signal ABP to a value that indicates to turn on the BTI protection mode for channel 120 in operation 211.

In the automatic BTI protection mode, the multiplexer circuit 112 provides the value of the automatic BTI protection signal ABP to the multiplexer select circuit 111 in the SEL signal. In response to the automatic BTI protection signal ABP being asserted, the multiplexer circuit 112 asserts the select signal SEL to a value that indicates to turn on the BTI protection mode. In response to the select signal SEL being asserted to a value that indicates to turn on BTI protection mode, multiplexer select circuit 111 causes the clock multiplexer 101 to select the BTICLK clock signal as the output clock signal TCLKOUT provided to the channel circuit 120. In response to receiving the BTICLK clock signal as the TCLKOUT clock signal, BTI protection mode is turned on for channel circuit 120 (and/or other selected channels in transceiver circuit 103). As a result of receiving the lower frequency clock signal TCLKOUT, channel circuit 120 (and/or other channels in transceiver circuit 103) experience less degradation caused by BTI aging effects during the BTI protection mode. BTI protection mode is only used for channels in the transceiver circuit 103 that are not powered down and that continue to receive an input clock signal. BTI protection mode is not used for channels in transceiver circuit 103 that are powered down or for which input clock signals have been gated off.

In operation 212, the BTI mitigation circuit 114 continues to check for circuit activity in transceiver circuit 103 (e.g., channel circuit 120) based on the one or more feedback signals FDBK. If one or more of the feedback signals FDBK indicate that the transceiver circuit 103 (channel 120) is active in operation 209, normal operation is resumed in operation 206 by de-asserting the automatic BTI protection signal ABP to cause the clock multiplexer circuit 101 to select one of the input transceiver clock signals TCLKIN1 . . . TCLKINN as the output clock signal TCLKOUT. If one or more of the feedback signals FDBK indicate that the transceiver circuit 103 (channel 120) is inactive (idle) in operation 209, then the force auto BTI protection circuit 113 continues to assert the automatic BTI protection signal ABP, and channel circuit 120 remains in BTI protection mode, as discussed above.

Referring to FIG. 1, BTI mitigation circuit 114 generates one or more output signals EVMODE. BTI mitigation circuit 114 may, for example, cause the values of the EVMODE signals to indicate any internal engineering validation mode measurements, such as the data rate of data signal DIN or DOUT, adaption of transceiver circuit 103, a bit error rate of data signal DIN or DOUT, a maximum frequency of one of the feedback clock signals, and/or an adaptive shift for transceiver circuit 103. The EVMODE signals may be used, for example, for design-for-test or design-for-debug purposes.

In some implementations of the circuit system of FIG. 1, a user can monitor channels in the transceiver circuit 103 through the sideband interface circuit 115 in BTI clock protection circuit 102 using a user interface. The user interface may include, for example, debug toolkits or a system console in a computer aided design software tool. The user can also manually turn on an idle channel at any time through the sideband interface 115 using the user interface. The sideband interface circuit 115 receives one or more user control signals BINS as inputs from the user interface. The user interface controls the sideband interface 115 through the user control signals BINS and receives output signals BTS generated by sideband interface 115. The output signals BTS may, for example, indicate to the user interface that one or more of the channels in transceiver circuit 103 are in BTI protection mode in response to BTI mitigation control signal BMC being asserted.

A user can manually choose to turn on or turn off the BTI protection mode for one or more of the channels in the transceiver circuit 103 using the user interface and the user control signals BINS. For example, a user can manually turn on (or off) the BTI protection mode for channel circuit 120 through the sideband interface 115 using the user interface. The sideband interface circuit 115 may assert a first one of control signals SIC to cause force auto BTI protection circuit 113 to turn on the BTI protection mode for channel circuit 120 in transceiver circuit 103 by asserting the ABP signal, causing clock multiplexer circuit 101 to select the BTI clock signal as output clock signal TCLKOUT. The sideband interface circuit 115 may assert a second one of the control signals SIC to cause force auto BTI protection circuit 113 to turn off the BTI protection mode for one or more selected channels in transceiver circuit 103 (e.g., channel circuit 120) by de-asserting the ABP signal, causing clock multiplexer circuit 101 to select a transceiver input clock signal TCLKIN1 . . . TCLKINN as output clock signal TCLKOUT.

Figure 3A:
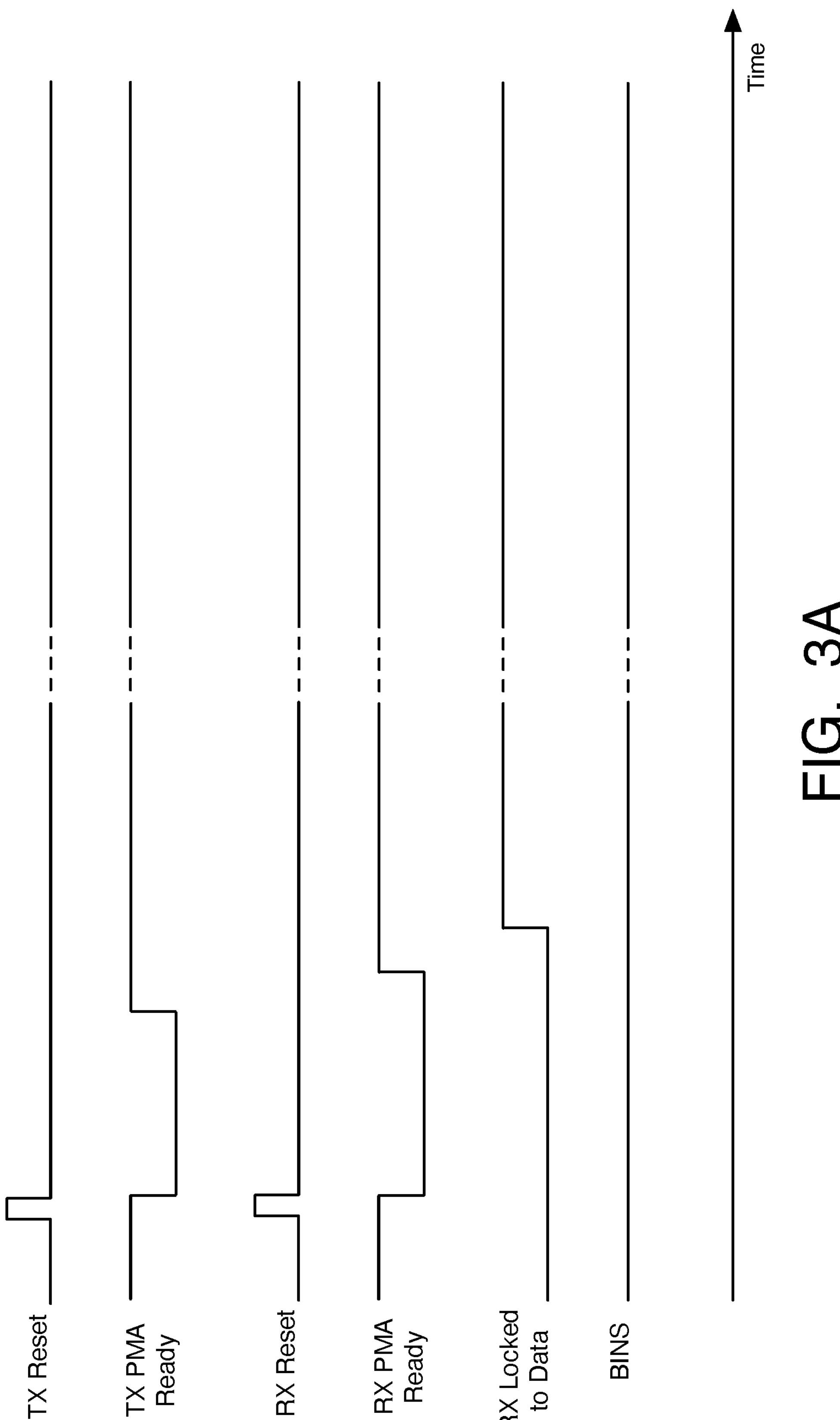
FIG. 3A is a timing diagram that illustrates examples of waveforms of the internal status signals generated by the transceiver circuit of FIG. 1.

FIG. 3A is a timing diagram that illustrates examples of waveforms of the internal status signals generated by the transceiver circuit 103 of FIG. 1. FIG. 3A illustrates waveforms for 5 internal status signals TX Reset, TX PMA Ready, RX Reset, RX PMA Ready, and RX Locked to Data. These 5 internal status signals are generated by one or more channels in the transceiver circuit 103, such as channel circuit 120. These 5 internal status signals may, for example, be provided from the transceiver circuit 103 to the BTI mitigation circuit 114 as a subset of the feedback signals FDBK. BTI mitigation circuit 114 may continuously or periodically monitor signals TX Reset, TX PMA Ready, RX Reset, RX PMA Ready, and RX Locked to Data to determine whether channel circuit 120 and/or other channels in transceiver circuit 103 are idle or active in operations 209 and 212.

As examples, signal TX Reset may be a reset signal generated for a transmitter circuit in transceiver circuit 103, and signal TX PMA Ready may be a ready signal generated by the transmitter circuit. As other examples, signal RX Reset may be a reset signal generated for a receiver circuit in transceiver circuit 103, and signal RX PMA Ready may be a ready signal generated by the receiver circuit. Signal RX Locked to Data may, for example, indicate when a clock data recovery (CDR) circuit in the receiver circuit has locked a clock signal to input data signals.

As shown in FIG. 3A, after a logic high pulse in the TX Reset signal, a logic low pulse is generated in the TX PMA Ready signal. BTI mitigation circuit 114 may, for example, interpret a logic high state in the TX PMA Ready signal as indicating that the transmitter circuit in the transceiver circuit 103 is active and ready to transmit data. As also shown in FIG. 3A, after a logic high pulse in the RX Reset signal, a logic low pulse is generated in the RX PMA Ready signal. Subsequently, the RX Locked to Data signal transitions to a logic high state, indicating that the clock data recovery circuit is locked to the input data signals. BTI mitigation circuit 114 may, for example, interpret a logic high state in the RX PMA Ready signal and/or in the RX Locked to Data signal as indicating that the receiver circuit in the transceiver circuit 103 is active and ready to transmit data. FIG. 3A also shows that the user control signals BINS are in logic low states indicating inactive signals.

Figure 3B:
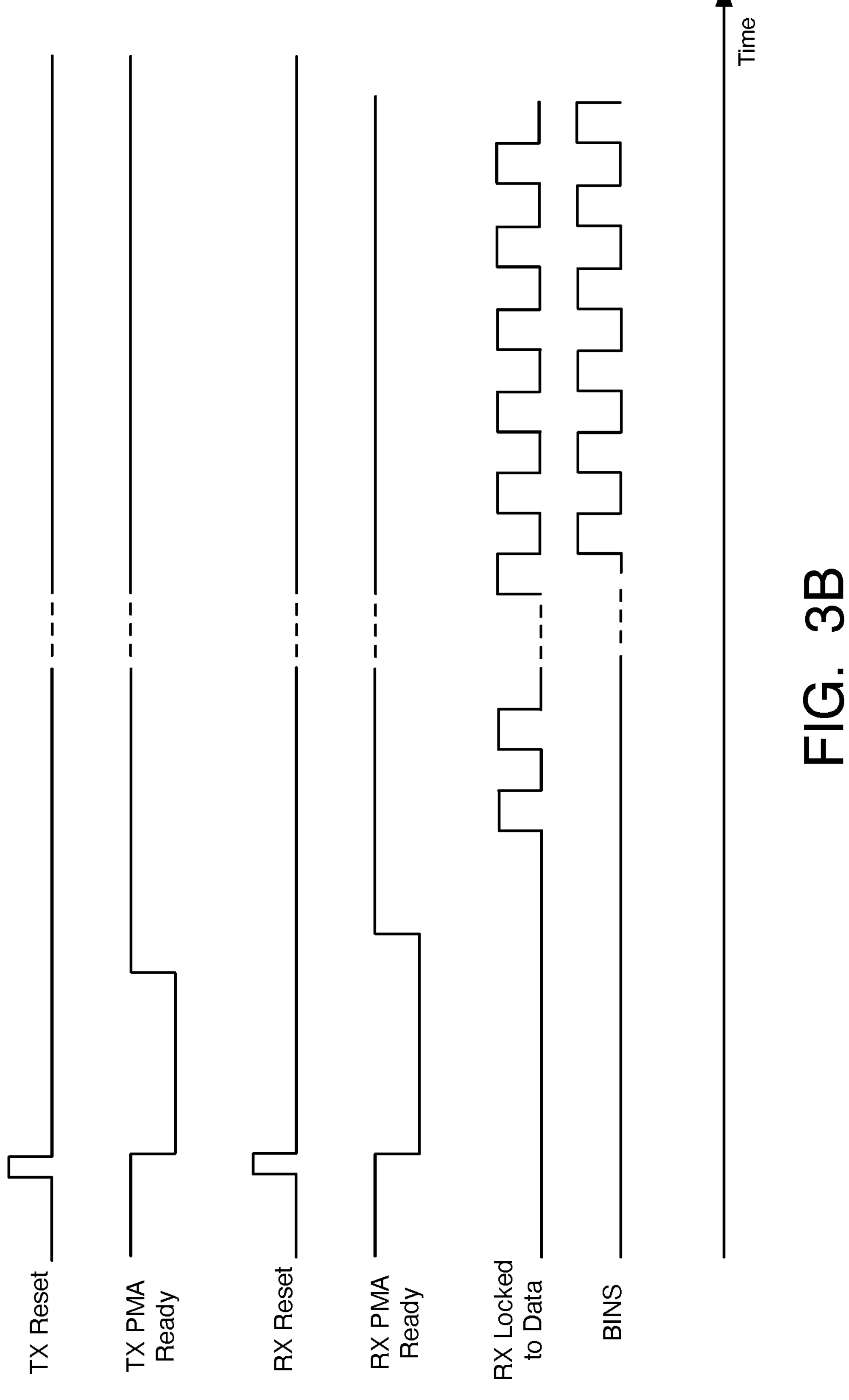
FIG. 3B is another timing diagram that illustrates additional examples of waveforms of the internal status signals generated by the transceiver circuit of FIG. 1.

FIG. 3B is another timing diagram that illustrates additional examples of waveforms of the internal status signals generated by the transceiver circuit 103 of FIG. 1. FIG. 3B illustrates waveforms for the same 5 internal status signals shown in FIG. 3A, including TX Reset, TX PMA Ready, RX Reset, RX PMA Ready, and RX Locked to Data. In FIG. 3B, the waveforms for the TX Reset, TX PMA Ready, RX Reset, and RX PMA Ready signals are the same as shown in FIG. 3A. In the example of FIG. 3B, the RX Locked to Data signal oscillates between logic high and low states after the logic low pulse in the RX PMA Ready signal. The oscillations in the RX Locked to Data signal indicate that the clock data recovery circuit in the transceiver circuit 103 is unable to consistently lock to the input data signals. As a result, the receiver circuit in transceiver circuit 103 may be idle. BTI mitigation circuit 114 may, for example, interpret the oscillations (or logic low states) in the RX Locked to Data signal as indicating that the receiver circuit in the transceiver circuit 103 is idle. FIG. 3B also illustrates a waveform for one or more of the user control signals BINS. As shown in FIG. 3B, one or more of the user control signals BINS oscillates between high and low logic states to manually turn on and off the BTI protection mode for one or more selected channels in transceiver circuit 103 through the sideband interface 115 in response to the BTI mitigation circuit 114 indicating in signal BMC that the one or more channels in transceiver circuit 103 are inactive or active, respectively.

FIG. 4 illustrates an example of a graphical user interface (GUI) generated by a user interface that receives the output signals BTS from sideband interface 115 and that generates the user control signals BINS shown in FIG. 1. The GUI of FIG. 4 shows information for an N number of channels CH0, CH1, CH2, . . . CNN in the transceiver circuit 103 of FIG. 1. N may be any positive integer greater than or equal to 4 in this example. The GUI of FIG. 4 displays the information in 6 columns. Three of the columns indicate status information, and three of the columns indicate control information. The first status column indicates the clock signal selected by multiplexer circuit 101 for the respective channel by displaying the selected transceiver clock signal (TCLKIN1 . . . TCLKINN) or the BTI protection clock signal BTICLK. The second status column displays the status of transceiver reset signals, such as the states of signals TX reset, TX PMA reset, RX reset, and RX PMA reset. The third status column displays the physical (PHY) layer status in the transceiver circuit 103, such as the phase-locked loop (PLL) lock signal status, the CDR lock status, the TX PMA ready status, and the RX PMA ready status. PMA refers to the physical medium attachment in the PHY layer of the Open Systems Interconnection (OSI) reference model.

The first control column in the GUI of FIG. 4 displays user options for the BTI protection mode including a user-controllable BTI instrumentation mode using user control signals BINS as described above, an automatic BTI protection mode using force auto BTI protection circuit 113 as described above, and a device rule based control (RBC) mode using the DCNTL signal as described above. The second control column in the GUI of FIG. 4 displays additional clock signals for a design-for-test (DFT) or design-for-debug (DFD) mode, including for example, transceiver clock signals (TCLKIN1 . . . TCLKINN), a BTI protection clock signal (BTICLK), a feedback clock signal (FDBK), a row clock signal, and/or a programmable logic device (PLD) clock signal. The third control column in the GUI of FIG. 4 displays internal engineering validation (EV) mode measurements provided to the user interface in the EVMODE signals of FIG. 1, such as, for example, a data rate of a data signal in the transceiver circuit 103, adaptation of the transceiver circuit 103, bit error rate (BER) and signal eye measurements of the data signal, a maximum frequency (Fmax) of a clock signal in the transceiver circuit 103, and/or adaptive shift of the transceiver circuit 103.

Figure 5:
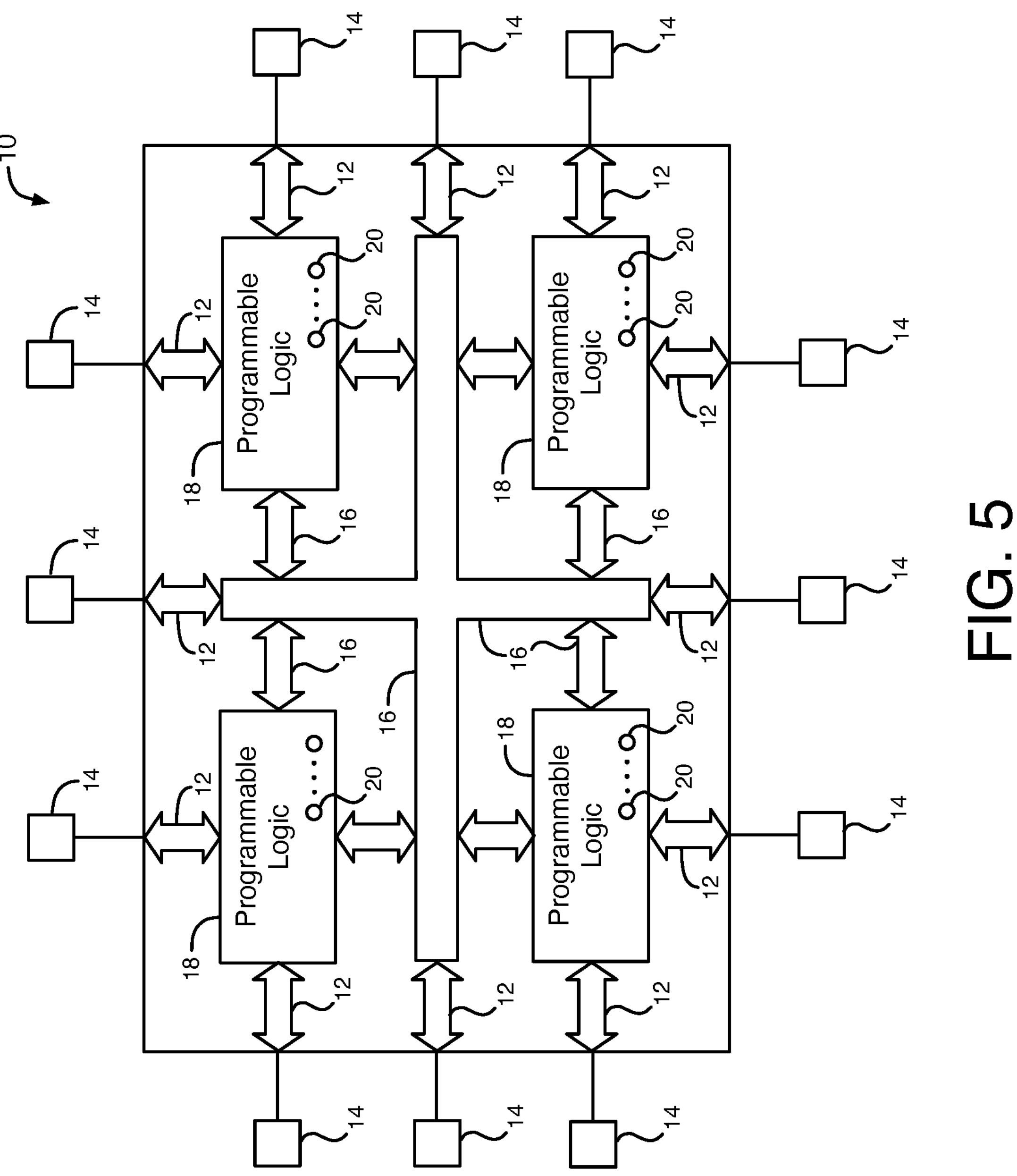
FIG. 5 is a diagram of an illustrative programmable logic integrated circuit (IC) that may include any of the circuitry shown in FIG. 1 herein.

FIG. 5 is a diagram of an illustrative programmable (i.e., configurable) logic integrated circuit (IC) 10 that may include any of the circuitry shown in FIG. 1 herein. As shown in FIG. 5, programmable logic integrated circuit 10 may have input-output circuitry 12 for driving signals off of IC 10 and for receiving signals from other devices via input-output pads 14. Interconnection resources 16 such as global, regional, and local vertical and horizontal conductive lines and buses may be used to route signals on IC 10. Interconnection resources 16 include fixed interconnects (conductive lines) and programmable interconnects (i.e., programmable connections between respective fixed interconnects). Programmable logic circuitry 18 may include combinational and sequential logic circuitry. Programmable logic circuitry 18 may be configured to perform custom logic functions. Programmable logic circuitry 18 may include clock multiplexer circuit 101 and BTI clock protection circuit 102, disclosed herein with respect to FIG. 1.

Programmable logic IC 10 contains memory elements 20 that can be loaded with configuration data using pads 14 and input-output circuitry 12. Once loaded, the memory elements 20 may each provide a corresponding static control output signal that controls the state of an associated logic component in programmable logic circuitry 18. Typically, the memory element output signals are used to control the gates of field-effect transistors. In the context of programmable integrated circuits, the memory elements 20 store configuration data and are sometimes referred to as configuration random-access memory (CRAM) cells.

In general, software and data for performing any of the functions disclosed herein may be stored in non-transitory computer readable storage media. Non-transitory computer readable storage media is tangible computer readable storage media that stores data for a significant period of time, as opposed to media that only transmits propagating electrical signals (e.g., wires). The software code may sometimes be referred to as software, data, program instructions, instructions, or code. The non-transitory computer readable storage media may, for example, include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Additional examples are now described. Example 1 is an integrated circuit comprising: a multiplexer circuit coupled to receive a first clock signal and a second clock signal, wherein the multiplexer circuit is coupled to provide an output clock signal to a channel; and a protection circuit coupled to receive a feedback signal from the channel, wherein the protection circuit causes the multiplexer circuit to provide oscillations in the second clock signal to the output clock signal in response to the feedback signal indicating that the channel is idle to cause the channel to be in a protection mode that reduces degradation from bias temperature instability, and wherein the protection circuit causes the multiplexer circuit to provide oscillations in the first clock signal to the output clock signal in response to the feedback signal indicating that the channel is active.

In Example 2, the integrated circuit of Example 1 may optionally include, wherein the protection circuit comprises: a bias temperature instability mitigation circuit coupled to receive the feedback signal, wherein the bias temperature instability mitigation circuit asserts a first control signal in response to the feedback signal indicating that the channel is idle; and an automatic control circuit that asserts a second control signal in response to the first control signal being asserted.

In Example 3, the integrated circuit of Example 2 may optionally include, wherein the protection circuit further comprises: an additional multiplexer circuit that asserts a select signal in response to the second control signal being asserted, wherein the multiplexer circuit provides oscillations in the second clock signal to the output clock signal in response to the select signal being asserted.

In Example 4, the integrated circuit of Example 1 may optionally include, wherein the protection circuit comprises: an additional multiplexer circuit coupled to the multiplexer circuit, wherein the additional multiplexer circuit controls whether the multiplexer circuit is in an automatic protection mode or in a manual protection mode in response to a first control signal.

In Example 5, the integrated circuit of Example 4 may optionally include, wherein the additional multiplexer circuit causes the multiplexer circuit to provide oscillations in the first clock signal or in the second clock signal to the output clock signal based on a second control signal in the manual protection mode.

In Example 6, the integrated circuit of Example 4 may optionally include, wherein the protection circuit further comprises: a bias temperature instability mitigation circuit coupled to receive the feedback signal, wherein the bias temperature instability mitigation circuit generates a second control signal based on the feedback signal; and an automatic control circuit that generates a third control signal based on the second control signal, wherein the additional multiplexer circuit causes the multiplexer circuit to provide oscillations in the first clock signal or in the second clock signal to the output clock signal based on the third control signal in the automatic protection mode.

In Example 7, the integrated circuit of any one of Examples 1-6 may optionally include, wherein the protection circuit comprises: a sideband interface circuit coupled to receive user control signals, wherein the protection circuit causes the multiplexer circuit to provide oscillations in the first clock signal or in the second clock signal to the output clock signal based on the user control signals received at the sideband interface circuit.

In Example 8, the integrated circuit of any one of Examples 1-7 may optionally include, wherein the protection circuit generates output signals that indicate internal engineering validation mode measurements in response to the feedback signal received from the channel.

In Example 9, the integrated circuit of any one of Examples 1-8 may optionally include, wherein the feedback signal comprises at least one of a feedback clock signal from the channel or an activity status signal from the channel, and wherein the second clock signal has a lower frequency than a frequency of the first clock signal.

Example 10 is a method for controlling a bias temperature instability protection mode in a channel, wherein the method comprises: receiving a feedback signal from the channel at a control circuit; generating a select signal with the control circuit based on the feedback signal indicating activity in the channel; providing oscillations in a first clock signal to an output clock signal using a multiplexer circuit in response to the select signal indicating that the channel is active, wherein the output clock signal is provided to the channel; and providing oscillations in a second clock signal to the output clock signal using the multiplexer circuit in response to the select signal indicating that the channel is inactive to cause the channel to be in the bias temperature instability protection mode that reduces degradation from bias temperature instability.

In Example 11, the method of Example 10 may further comprise: asserting a first control signal in response to the feedback signal indicating that the channel is inactive using a bias temperature instability mitigation circuit that is coupled to receive the feedback signal; and asserting a second control signal in response to the first control signal being asserted using an automatic protection control circuit to cause the select signal to indicate that the channel is inactive.

In Example 12, the method of Example 11 may further comprise: asserting the select signal to a value that indicates that the channel is inactive in response to the second control signal being asserted using an additional multiplexer circuit.

In Example 13, the method of Example 10 may further comprise: controlling whether the multiplexer circuit is in an automatic protection mode or in a manual protection mode in response to a first control signal using an additional multiplexer circuit.

In Example 14, the method of Example 13 may further comprise: generating a second control signal in response to the feedback signal with a bias temperature instability mitigation circuit; generating a third control signal in response to the second control signal with an automatic protection circuit; and causing the multiplexer circuit to provide oscillations in the first clock signal or in the second clock signal to the output clock signal with the additional multiplexer circuit based on the third control signal in the automatic protection mode.

In Example 15, the method of any one of Examples 10-14 may further comprise: causing the multiplexer circuit to provide oscillations in the first clock signal or in the second clock signal to the output clock signal based on user control signals received at a sideband interface circuit in the control circuit.

In Example 16, the method of any one of Examples 10-14 may further comprise: generating output status signals that indicate that the channel is in the bias temperature instability protection mode in response to the feedback signal indicating that the channel is inactive using a sideband interface circuit in the control circuit.

Example 17 is a circuit system comprising: a transceiver circuit comprising a channel; a multiplexer circuit coupled to provide an output clock signal to the transceiver circuit; and a clock protection control circuit that causes the multiplexer circuit to provide a first clock signal as the output clock signal in response to a feedback signal from the channel indicating that the channel is inactive to cause the channel to be in a bias temperature instability protection mode that reduces degradation in the channel, and wherein the clock protection control circuit causes the multiplexer circuit to provide a second clock signal as the output clock signal in response to the feedback signal indicating that the channel is active.

In Example 18, the circuit system of Example 17 may optionally include, wherein the clock protection control circuit comprises: a bias temperature instability mitigation circuit that generates a first control signal in response to the feedback signal; and an additional multiplexer circuit that controls whether the multiplexer circuit is in an automatic protection mode or in a manual protection mode in response to a second control signal, wherein the additional multiplexer circuit causes the multiplexer circuit to provide the first clock signal or the second clock signal as the output clock signal based on the first control signal in the automatic protection mode.

In Example 19, the circuit system of any one of Examples 17-18 may optionally include, wherein the clock protection control circuit comprises: a sideband interface circuit, wherein the clock protection control circuit causes the multiplexer circuit to provide the first clock signal as the output clock signal based on user control signals received at the sideband interface circuit to cause the channel to be in the bias temperature instability protection mode.

In Example 20, the circuit system of any one of Examples 17-19 may optionally include, wherein the channels transmits or receives data in a data signal in response to the second clock signal during a normal mode.

The foregoing description of the examples has been presented for the purpose of illustration. The foregoing description is not intended to be exhaustive or to be limiting to the examples disclosed herein. In some instances, features of the examples can be employed without a corresponding use of other features as set forth. Many modifications, substitutions, and variations are possible in light of the above teachings.

What is claimed is:

1. An integrated circuit comprising:

a first multiplexer circuit coupled to receive a first clock signal and a second clock signal, wherein the first multiplexer circuit is coupled to provide an output clock signal to a channel; and a protection circuit coupled to receive a feedback signal from the channel, wherein the protection circuit causes the first multiplexer circuit to provide oscillations in the second clock signal to the output clock signal in response to the feedback signal indicating that the channel is idle to cause the channel to be in a first protection mode that reduces degradation from bias temperature instability, wherein the protection circuit causes the first multiplexer circuit to provide oscillations in the first clock signal to the output clock signal in response to the feedback signal indicating that the channel is active, wherein the protection circuit comprises a second multiplexer circuit coupled to the first multiplexer circuit, and wherein the second multiplexer circuit controls whether the first multiplexer circuit is in an automatic protection mode or in a manual protection mode in response to a first control signal.

2. The integrated circuit of claim 1, wherein the protection circuit further comprises:

a bias temperature instability mitigation circuit coupled to receive the feedback signal, wherein the bias temperature instability mitigation circuit asserts a second control signal in response to the feedback signal indicating that the channel is idle; and an automatic control circuit that asserts a third control signal in response to the second control signal being asserted.

3. The integrated circuit of claim 2, wherein the second multiplexer circuit asserts a select signal in response to the third control signal being asserted and in response to the first control signal indicating the automatic protection mode, and wherein the first multiplexer circuit provides oscillations in the second clock signal to the output clock signal in response to the select signal being asserted.

4. The integrated circuit of claim 1, wherein the integrated circuit is a configurable logic integrated circuit.

5. The integrated circuit of claim 1, wherein the second multiplexer circuit causes the first multiplexer circuit to provide oscillations in the first clock signal or in the second clock signal to the output clock signal based on a second control signal in the manual protection mode.

6. The integrated circuit of claim 1, wherein the protection circuit further comprises:

a bias temperature instability mitigation circuit coupled to receive the feedback signal, wherein the bias temperature instability mitigation circuit generates a second control signal based on the feedback signal; and an automatic control circuit that generates a third control signal based on the second control signal, wherein the second multiplexer circuit causes the first multiplexer circuit to provide oscillations in the first clock signal or in the second clock signal to the output clock signal based on the third control signal in the automatic protection mode.

7. The integrated circuit of claim 1, wherein the protection circuit comprises:

a sideband interface circuit coupled to receive user control signals, wherein the protection circuit causes the first multiplexer circuit to provide oscillations in the first clock signal or in the second clock signal to the output clock signal based on the user control signals received at the sideband interface circuit.

8. The integrated circuit of claim 1, wherein the protection circuit generates output signals that indicate internal engineering validation mode measurements in response to the feedback signal received from the channel.

9. The integrated circuit of claim 1, wherein the feedback signal comprises at least one of a feedback clock signal from the channel or an activity status signal from the channel, and wherein the second clock signal has a lower frequency than a frequency of the first clock signal.

10. A method for controlling a bias temperature instability protection mode in a channel, wherein the method comprises:

receiving a feedback signal from the channel at a control circuit;

controlling whether a first multiplexer circuit is in an automatic protection mode or in a manual protection mode in response to a first control signal using a second multiplexer circuit;

generating a select signal with the second multiplexer circuit in the control circuit based on the feedback signal indicating activity in the channel;

providing oscillations in a first clock signal to an output clock signal using the first multiplexer circuit in response to the select signal indicating that the channel is active, wherein the output clock signal is provided to the channel; and providing oscillations in a second clock signal to the output clock signal using the first multiplexer circuit in response to the select signal indicating that the channel is inactive to cause the channel to be in the bias temperature instability protection mode that reduces degradation from bias temperature instability.

11. The method of claim 10 further comprising:

asserting a second control signal in response to the feedback signal indicating that the channel is inactive using a bias temperature instability mitigation circuit that is coupled to receive the feedback signal; and asserting a third control signal in response to the second control signal being asserted using an automatic protection control circuit to cause the select signal to indicate that the channel is inactive.

12. The method of claim 11 further comprising:

asserting the select signal to a value that indicates that the channel is inactive in response to the third control signal being asserted using the second multiplexer circuit.

13. The method of claim 10, wherein the control circuit is in a configurable logic integrated circuit.

14. The method of claim 10 further comprising:

generating a second control signal in response to the feedback signal with a bias temperature instability mitigation circuit;

generating a third control signal in response to the second control signal with an automatic protection circuit; and causing the first multiplexer circuit to provide oscillations in the first clock signal or in the second clock signal to the output clock signal with the second multiplexer circuit based on the third control signal in the automatic protection mode.

15. The method of claim 10 further comprising:

causing the first multiplexer circuit to provide oscillations in the first clock signal or in the second clock signal to the output clock signal based on user control signals received at a sideband interface circuit in the control circuit.

16. The method of claim 10 further comprising:

generating output status signals that indicate that the channel is in the bias temperature instability protection mode in response to the feedback signal indicating that the channel is inactive using a sideband interface circuit in the control circuit.

17. A circuit system comprising:

a transceiver circuit comprising a channel;

a first multiplexer circuit coupled to provide an output clock signal to the transceiver circuit; and a clock protection control circuit that causes the first multiplexer circuit to provide a first clock signal as the output clock signal in response to a feedback signal from the channel indicating that the channel is inactive to cause the channel to be in a bias temperature instability protection mode that reduces degradation in the channel, wherein the clock protection control circuit causes the first multiplexer circuit to provide a second clock signal as the output clock signal in response to the feedback signal indicating that the channel is active, and wherein the clock protection control circuit comprises a second multiplexer circuit that controls whether the first multiplexer circuit is in an automatic protection mode or in a manual protection mode in response to a first control signal.

18. The circuit system of claim 17, wherein the clock protection control circuit further comprises:

a bias temperature instability mitigation circuit that generates a second control signal in response to the feedback signal, wherein the second multiplexer circuit causes the first multiplexer circuit to provide the first clock signal or the second clock signal as the output clock signal based on the first second control signal in the automatic protection mode.

19. The circuit system of claim 17, wherein the clock protection control circuit further comprises:

a sideband interface circuit, wherein the clock protection control circuit causes the first multiplexer circuit to provide the first clock signal as the output clock signal based on user control signals received at the sideband interface circuit to cause the channel to be in the bias temperature instability protection mode.

20. The circuit system of claim 17, wherein the second multiplexer circuit causes the first multiplexer circuit to provide the first clock signal or the second clock signal as the output clock signal based on a second control signal in the manual protection mode.

* * * * *